United States Patent
Hirakawa et al.

(10) Patent No.: US 9,913,417 B2
(45) Date of Patent: Mar. 6, 2018

(54) APPARATUS AND METHOD OF LOADING COMPONENTS

(71) Applicant: HANWHA TECHWIN CO., LTD., Changwon-si (KR)

(72) Inventors: Toshiro Hirakawa, Changwon-si (KR); Yoichiro Sugimoto, Changwon-si (KR); Kazuhiro Takeshita, Changwon-si (KR); Kenji Ishiyama, Changwon-si (KR)

(73) Assignee: HANWHA TECHWIN CO., LTD., Changwon-si (KR)

( * ) Notice: Subject to any disclaimer, the term of this patent is extended or adjusted under 35 U.S.C. 154(b) by 637 days.

(21) Appl. No.: 14/496,458

(22) Filed: Sep. 25, 2014

(65) Prior Publication Data

US 2015/0093228 A1    Apr. 2, 2015

(30) Foreign Application Priority Data

Sep. 30, 2013  (KR) .................. 10-2013-0116842
Sep. 30, 2013  (KR) .................. 10-2013-0116845
Apr. 8, 2014   (JP) ................... 2014-079510
Aug. 25, 2014  (JP) ................... 2014-170745

(51) Int. Cl.
    *H05K 13/02* (2006.01)
(52) U.S. Cl.
    CPC .................. *H05K 13/021* (2013.01)
(58) Field of Classification Search
    CPC ..... H05K 13/021; A47L 5/38; B23Q 11/0045; B23Q 11/0046; D01H 11/005
    See application file for complete search history.

(56) References Cited

U.S. PATENT DOCUMENTS

| | | | | |
|---|---|---|---|---|
| 5,839,187 A | * | 11/1998 | Sato | .................. H01L 21/67144 29/743 |
| 5,894,657 A | * | 4/1999 | Kanayama | ......... H05K 13/0069 29/721 |
| 6,524,052 B1 | * | 2/2003 | Yamauchi | ............ H05K 13/021 414/222.01 |
| 2013/0160282 A1 | * | 6/2013 | Kawaguchi | .......... H05K 13/021 29/592.1 |

FOREIGN PATENT DOCUMENTS

| | | |
|---|---|---|
| JP | 07-038284 A | 2/1995 |
| JP | 5261632 B2 | 8/2013 |
| KR | 10-2008-0029444 A | 4/2008 |

* cited by examiner

*Primary Examiner* — Dung Van Nguyen
(74) *Attorney, Agent, or Firm* — Ladas & Parry LLP (57) ABSTRACT

Provided is a component loading apparatus which includes: a work table comprising a working plane; a component recognizer configured to recognize components placed on the working plane of the work table; a head configured to suck the components; and a tray support for supporting a tray on which the components sucked by the head are loaded. The component loading apparatus further includes: an impurity remover configured to remove impurities attached onto the components in at least one of a first state of being placed on the working plane of the work table and a second state of being sucked by the head; and a tray analyzer configured to inspect loading positions of the components on the tray.

13 Claims, 8 Drawing Sheets

APPARATUS AND METHOD OF LOADING COMPONENTS

CROSS-REFERENCE TO RELATED APPLICATIONS

This application claims priority from Korean Patent Application No. 10-2013-0116842, filed on Sep. 30, 2013 and Korean Patent Application No. 10-2013-0116845, filed on Sep. 30, 2013, in the Korean Intellectual Property Office and Japanese Patent Application No. 2014-079510, filed on Apr. 8, 2014 and Japanese Patent Application No. 2014-170745, filed on Aug. 25, 2014 in the Japanese Patent Office, the disclosures of which are incorporated herein in their entirety by reference.

BACKGROUND

1. Field

Apparatuses and methods consistent with exemplary embodiments relate to a component loading apparatus and a method of loading components.

2. Description of the Related Art

Recently, the importance of technology for manufacturing high-performance micro-components has increased. Components manufactured in a large quantity may be separately packed and released, but a large number of components may be loaded on a tray, packed, and sold because manufacturers of electronic products may perform a process of inserting the large number of components into component mounting equipment.

In that case, only good components but not defective components are left in a packaging tray that is sold or shipped, and technology for massively and quickly manufacturing this kind of packaging tray has been developed.

SUMMARY

One or more exemplary embodiments provide a component loading apparatus and method thereof that may improve performance of loading components on a tray.

Various aspects of the exemplary embodiments will be set forth in part in the description which follows and, in part, will be apparent from the description, or may be learned by practice of the exemplary embodiments.

According to an aspect of an exemplary embodiment, there is provided a component loading apparatus which may include: a work table comprising a working plane; a component recognizer configured to recognize components placed on the working plane of the work table; a head configured to suck the components; and a tray support for supporting a tray on which the components sucked by the head are loaded.

The component recognizer may include a component recognition camera.

The head may include a plurality of nozzles configured to suck the components, and the head may be a rotary head having the plurality of nozzles attached thereto.

The component loading apparatus may further include a component provider which provides the components to the work table.

The component loading apparatus may further include component analyzer which has a component inspection camera.

The component analyzer may be configured to inspect the components in at least one of a first state of being placed on the working plane of the work table and a second state of being sucked by the head.

The component analyzer may include: a first component analyzer configured to inspect the components in the first state; and a second component analyzer configured to inspect the components in the second state.

The component loading apparatus may further include an impurity remover configured to remove impurities attached onto the components in at least one of the first state and the second state.

The impurity remover may have an air blow nozzle which discharges air and a vacuum suction which sucks impurities.

The impurity remover may include: a first impurity remover configured to remove impurities attached onto the components in the first state; and a second impurity remover configured to remove impurities attached onto the components in the second state.

The component loading apparatus may further include a tray analyzer configured to inspect loading positions of the components on the tray.

The tray analyzer may include a tray inspection camera which captures an image of an upper surface of the tray.

According to an aspect of another exemplary embodiment, there is provided a method of loading components which may include: placing the components on a working plane of a work table; recognizing the component placed on the working plane of the work table; sucking the recognized components by using a head of the apparatus and transporting the recognized components by using a guide; and loading components, which are selected from among the transported components, on a tray.

The above method may further include removing impurities attached onto the recognized components at least one of a first state of being placed on the working plane of the work table and a second state of being attached to the head.

The above method may further include removing impurities attached onto the recognized components at least one of a first state of being placed on the working plane of the work table and a second state of being attached to the head.

The above method may further include inspecting loading positions of the recognized components on the tray using a tray analyzer.

After the loading only good components, an image of an upper surface of the tray may be captured, and whether the tray has defects may be determined by using the captured image. Here, the tray may be a packaging tray in which the good components are packed for shipment or sale.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EXEMPLARY EMBODIMENTS

Reference will now be made in detail to exemplary embodiments, which are illustrated in the accompanying drawings. Like reference numerals refer to like elements throughout, and repeated descriptions thereof will not be provided.

Figure 1:
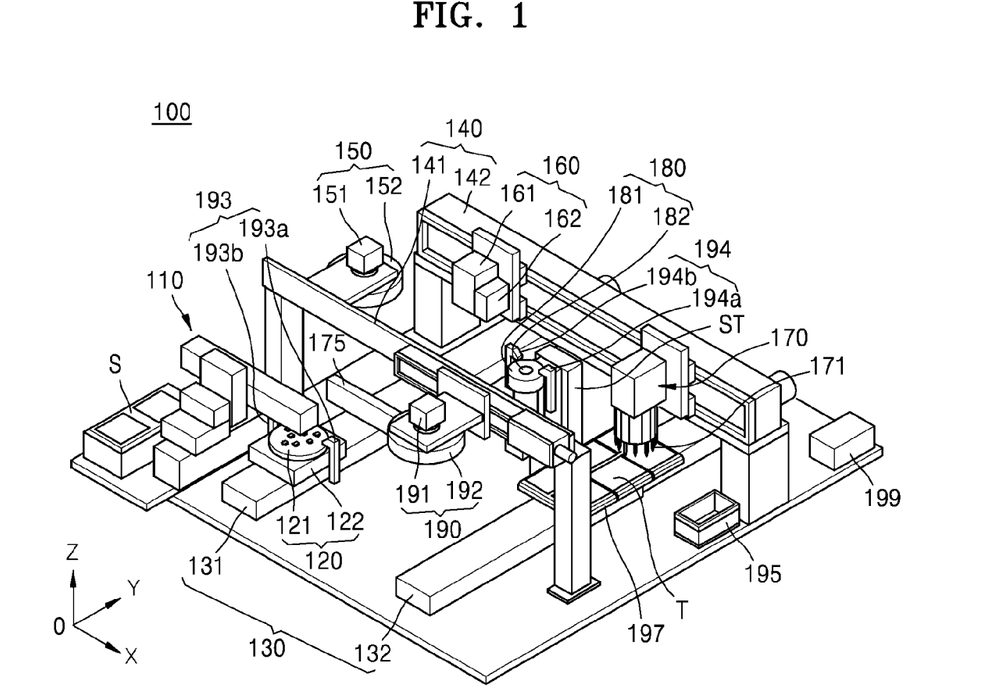
FIG. 1 is a schematic perspective view of a component loading apparatus according to an exemplary embodiment.
Figure 2:
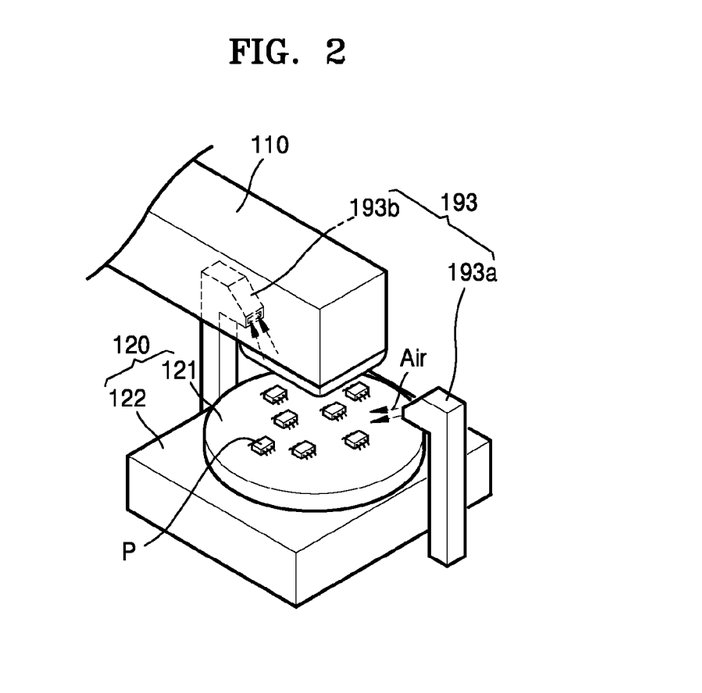
FIG. 2 is a schematic perspective view showing that components are transported from a component provider of the component loading apparatus to a work table and impurities on the components are removed by a first impurity remover, according to an exemplary embodiment.
Figure 3:
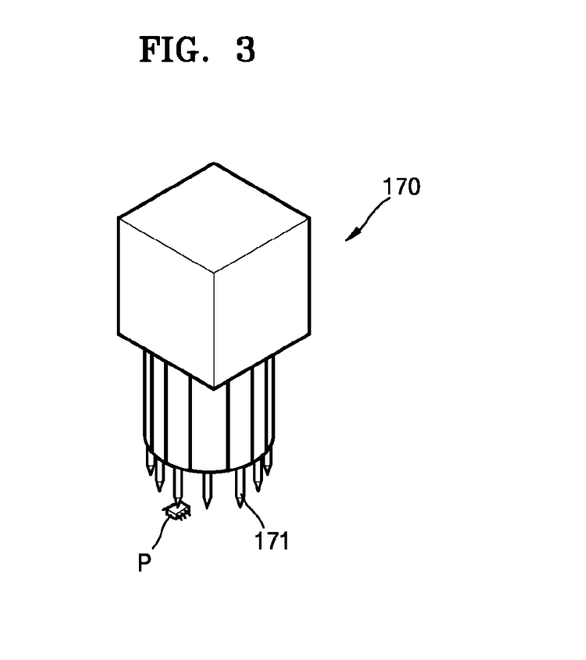
FIG. 3 is a schematic perspective view showing that nozzles of a rotary head of the component loading apparatus suck components, according to an exemplary embodiment.
Figure 4:
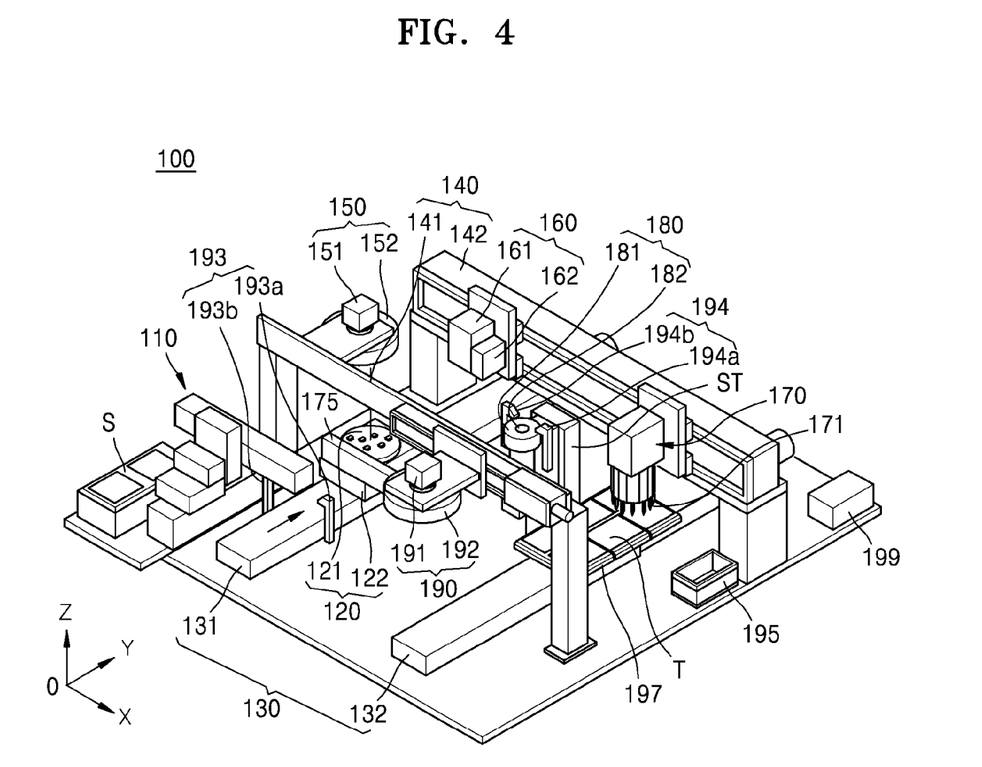
FIGS. 4 through 8 are schematic perspective views sequentially showing operations of the component loading apparatus, according to an exemplary embodiment.

FIG. 1 is a schematic perspective view of a component loading apparatus 100, and FIG. 2 is a schematic perspective view showing that components P are provided from a component provider 110 of the component loading apparatus 100 to a work table 120 and impurities of the components P are removed by a first impurity remover 193, and FIG. 3 is a schematic perspective view showing that nozzles 171 of a rotary head 170 of the component loading apparatus 100 suck the components P.

The component loading apparatus 100 receives a large number of components P that are completely manufactured in individual units, sorts out defective components from the components P so as to select components having a good quality (good components), and then places the selected components P on a tray T in an accurately arranged state.

The component loading apparatus 100 includes the component provider 110, the work table 120, a first guide 130, a second guide 140, a component recognizer 150, a first component analyzer 160, the rotary head 170, a component retriever 175, a second component analyzer 180, a tray analyzer 190, the first impurity remover 193, a second impurity remover 194, a dump box 195, a tray support 197, and a controller 199.

The component provider 110 provides the work table 120 with components P which are completely manufactured.

The component provider 110 transports the components P placed on a supplier S onto a working plane 121 of the work table 120. As shown in FIG. 2, the components P discharged from an end of the component provider 110 may be placed on the working plane 121 of the work table 120.

A well-known method may be applied to a structure of the component provider 110, and examples of the method may be a method of using a robot arm, a method of sucking the components P with vacuum, transporting the sucked components P by using pneumatic pressure, and discharging the transported components P to another end.

The component loading apparatus 100 includes the component provider 110, but is not limited thereto. That is, the component loading apparatus 100 may not include the component provider 110, and in that case, a worker manually transports the components P to the work table 120.

The work table 120 transports the components P provided by the component provider 110 and may be used for a component recognition process and a component suction process.

The work table 120 includes the working plane 121 where the components P are placed and a table support 122 supporting the working plane 121.

The working plane 121 may be formed of a thin elastic film that may freely be extended or contracted to help classifying the components P placed on the working plane 121. In that case, since the working plane 121 is extended due to an operation of an extension device (not shown) located inside the table support 122 after the components P are placed on the working plane 121, the components P placed on the working plane 121 have enlarged gaps therebetween, and thus, a component recognition process and a component suction process may be easily performed.

The table support 122 has a structure in which the table support 122 is combined with the first guide 130 and moves in a Y-axis direction while the table support 122 supports the working plane 121. For example, screw bars are installed on the first guide 130, and nuts, to which the screw bars are coupled, are installed at a bottom of the table support 122. Thus, the table support 122 may be configured to move as the screw bars rotate.

The first guide 130 has a structure in which the work table 120 and the tray support 197 may move in the Y-axis direction.

The structure of the first guide 130 is a structure in which the work table 120 and the tray support 197 move in the Y-axis direction according to control of the controller 199. However, a detailed structure of the first guide 130 or a method of moving the work table 120 and the tray support 197 is not limited thereto. For example, the first guide 130 may have a well-known linear movement structure (e.g., a screw-nut coupling movement structure, a linear motor movement structure, a conveyor belt movement structure, etc.) without any limitation.

The first guide 130 includes a work table guide 131 that moves the working table 120 in the Y-axis direction and a tray guide 132 that moves the tray support 197 in the Y-axis direction.

The second guide 140 has a structure in which the component recognizer 150, the first component analyzer 160, the rotary head 170 and the tray analyzer 190 may move in the X-axis direction.

The structure of the second guide 140 is a structure in which the component recognizer 150, the first component analyzer 160, the rotary head 170, and the tray analyzer 190 move in the X-axis direction according to control of the controller 199. However, a detailed structure of second guide 140 or a method of moving the component recognizer 150, the rotary head 170, and the tray analyzer 190 is not limited thereto. For example, the second guide 140 may have a well-known linear movement structure (e.g., a movable gantry structure, a roller movement structure installed on a guide beam, a screw-nut coupling movement structure, a linear motor movement structure, a rope-pulley coupling movement structure, etc.) without any limitation.

The second guide 140 includes a front guide 141 that moves the component recognizer 150 and the tray analyzer 190 in the X-axis direction and a rear guide 142 that moves the first component analyzer 160 and the rotary head 170 in the X-axis direction.

The component recognizer 150 includes a component recognition camera 151 and a light source 152, and is installed along the front guide 141 to move in the X-axis direction, as described above.

The component recognition camera 151 captures images of the components P placed on the working plane 121 of the working table 120. The controller 199 may calculate a location of each component P with regard to an X-axis and a Y-axis and a rotation angle (θ) of each component P by using the images of the components P, which are captured by the component recognition camera 151.

The light source 152 provides a sufficient amount of light required when the component recognition camera 151 captures images of the components P.

The first component analyzer 160 includes a first component inspection camera 161 and a light source 162, and as described above, is installed to move along the rear guide 142 in the X-axis direction.

The first component inspection camera 161 captures images of the components P placed on the working plane 121 of the work table 120. The controller 199 performs an exterior inspection of each component P by using the images of the components P which are captured by the first component inspection camera 161 so as to sort good components and defective components, and identifies a central location of each component P.

The light source 162 provides a sufficient amount of light required when the first component inspection camera 161 captures images of the components P.

The rotary head 170 includes the nozzles 171 arranged in a circumferential direction, and as described above, the rotary head 170 are installed along the rear guide 142 to move in the X-axis direction.

As shown in FIG. 3, a structure of the rotary head 170 may be similar to that of a rotary head used in a related art chip mounter. After the rotary head 170 moves to a location corresponding to a location of each component P, the nozzles 171 of the rotary head 170 descend and pick up the components P placed on the working plane 121 of the work table 120 by using vacuum suction force. Then, in a case where the components P are loaded on the tray T, vacuum inside the nozzles 171 is broken and the components P may be placed in the component grooves G.

The component retriever 175 retrieves defective components that are not transported by the rotary head 170 when the first component analyzer 160 determines that some of the components P have defects. The component retriever 175 is installed adjacent to the work table guide 131.

The component retriever 175 has a structure in which the defective components left on the working plane 121 of the work table 120 may be removed. However, the structure of the component retriever 175 is not limited thereto. For example, the component retriever 175 may have a structure in which the components P are sucked by using vacuum.

The second component analyzer 180 includes a light source 181 and a second component inspection camera 182 and is installed on a support ST adjacent to the rear guide 142.

The light source 181 provides a sufficient amount of light required when second component inspection camera 182 captures images of the components P.

The second component inspection camera 182 captures images of surfaces of components sucked on one end of each nozzle 171. The controller 199 performs an exterior inspection for inspecting a surface of each component P by using the images captured by the second component inspection camera 182 and classifies the components P into good and defective components.

The tray analyzer 190 includes a tray inspection camera 191 and a light source 192. As described above, the tray analyzer 190 is installed along the rear guide 141 to move in the X-axis direction.

The tray inspection camera 191 captures an image of an upper surface of the tray T placed on the tray support 197. The controller 199 uses the image captured by the tray inspection camera 191 and may determine whether any component P is not installed in a component groove G of the tray T and whether the components P are arranged well in the component groove G.

The light source 192 provides a sufficient amount of light required when the tray inspection camera 191 captures the image of the upper surface of the tray T.

The first impurity remover 193 is arranged around the work table guide 131 and removes impurities such as dust attached onto the components P placed on the working plane 121 of the work table 120.

The first impurity remover 193 includes a first air blow nozzle 193*a* and a first vacuum suction 193*b*. An end of the first air blow nozzle 193*a* and that of the first vacuum suction 193*b* are installed to face the working plane 121 of the work table 120. Therefore, when the work table 120 passes the first impurity remover 193, the controller 199 blows the impurities such as dust attached onto the components P by strongly discharging air through the first air blow nozzle 193*a*, and the first vacuum suction 193*b* sucks the blown impurities.

The component loading apparatus 100 includes the first impurity remover 193, but the embodiment is not limited thereto. That is, the component loading apparatus 100 according to one or more embodiments may not include the first impurity remover 193.

The second impurity remover 194 is arranged on the support ST adjacent to the rear guide 142 and removes impurities such as dust attached onto the components P that are sucked by the nozzles 171 of the rotary head 170.

The second impurity remover 194 includes a second air blow nozzle 194*a* and a second vacuum suction 194*b*. An end of the second air blow nozzle 194*a* and that of the second vacuum suction 194*b* are arranged to face the rotary head 170. Therefore, when the rotary head 170 passes the second impurity remover 194, the controller 199 blows the impurities such as dust attached onto the components P by strongly discharging air through the second air blow nozzle 194*a*, and the second vacuum suction 194*b* sucks the blown impurities.

In the present embodiment, the component loading apparatus 100 includes the second impurity remover 194, but is not limited thereto. That is, the component loading apparatus 100 according to one or more embodiments may not include the second impurity remover 194.

The dump box 195 collects components that are determined as defective components based on the images captured by the second component analyzer 180. That is, the controller 199 analyzes the images of the components, which are captured by the second component analyzer 180, and classifies the components P into the good and defective components. The good components are loaded on the tray T, and the defective components are collected by moving the rotary head 170 to an upper region of the dump box 195.

The controller 199 controls parts configuring the component loading apparatus 100. The controller 199 may be configured by including a circuit device such as an integrated circuit chip, a circuit board, etc., a device operation program, or the like.

Referring to FIGS. 1 through 10, a process for loading the components P by using the component loading apparatus 100 will be described in detail.

Figure 9:
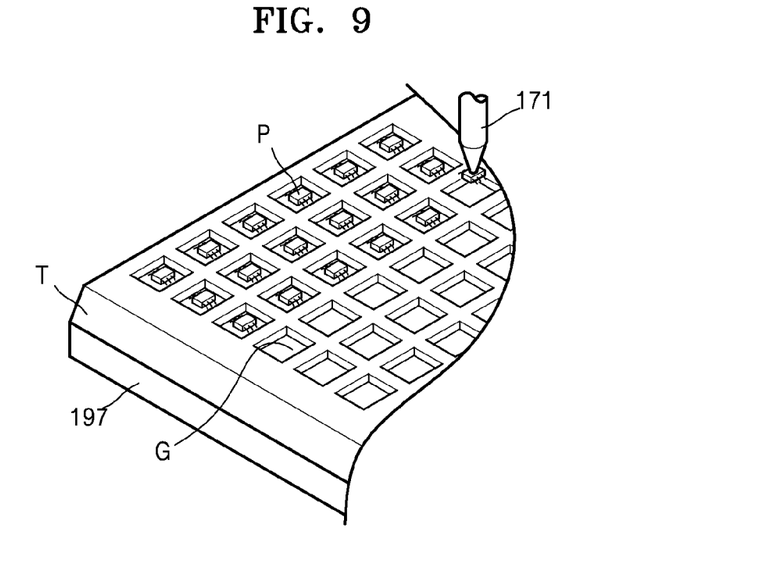
FIG. 9 is a schematic perspective view showing that nozzles of a rotary head of the component loading apparatus place components in component grooves of a tray, according to an exemplary embodiment.
Figure 10:
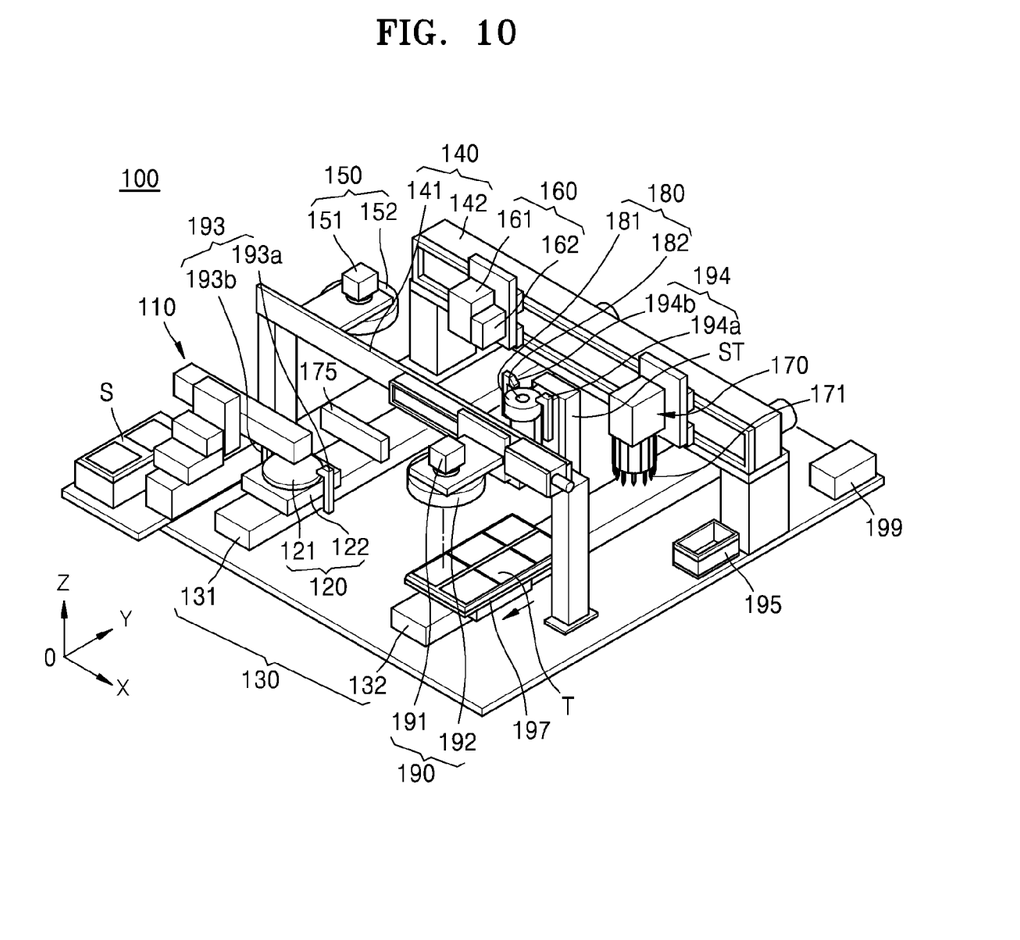
FIG. 10 is a schematic perspective view showing that a tray of the component loading apparatus, on which components are loaded, is moved to inspect whether there are misloaded components, according to an exemplary embodiment

FIGS. 4 through 8 are schematic perspective views sequentially showing operations of the component loading apparatus 100. Among FIGS. 4 through 8, FIGS. 5, 6 and 7 do not illustrate the front guide 141, the component recognizer 150, and the tray analyzer 190 for convenience of explanation. Also, FIG. 9 is a schematic perspective view showing that the nozzles 171 of the rotary head 170 place the components P in the component grooves G of the tray T, and FIG. 10 is a schematic perspective view showing that the tray T, on which the components P are loaded, is moved to inspect whether there are misloaded components.

The controller 199 operates the component provider 110 by using a previously input program and places the components P, which are placed on the supplier S, on the working plane 121 of the work table 120. As shown in FIGS. 1 and 2, the components P are discharged from an end of the component provider 110 and are placed on the working plane 121 of the work table 120.

The controller 199 blows the impurities such as dust attached onto the components P by strongly discharging air through the first air blow nozzle 193a towards the working plane 121 of the work table 120, and the first vacuum suction 193b sucks the blown impurities. That is, some pieces of the components P or ceramic powder may be adulterated while the components P are separated, and impurities such as the pieces of the components P or the ceramic powder reduce the accuracy in a recognition process and may result in faults in follow-up processes. Thus, the impurities may be removed through the processes.

The work table guide 131 moves the work table 120 in a positive Y-axis direction, and as described above, the work table 120 reaches a bottom of the component recognizer 150.

When the work table 120 reaches the bottom of the component recognizer 150, the working plane 121 of the work table 120 is extended, and it becomes easy to capture an image thereof due to the enlarged gaps between the components P. The light source 152 irradiates the light, and the component recognition camera 151 captures images of the components P placed on the working plane 121 of the work table 120.

The controller 199 may calculate a location of each component P with regard to an X-axis and a Y-axis and a rotation angle of each component P by using the images of the components P, which are captured by the component recognition camera 151.

Figure 5:
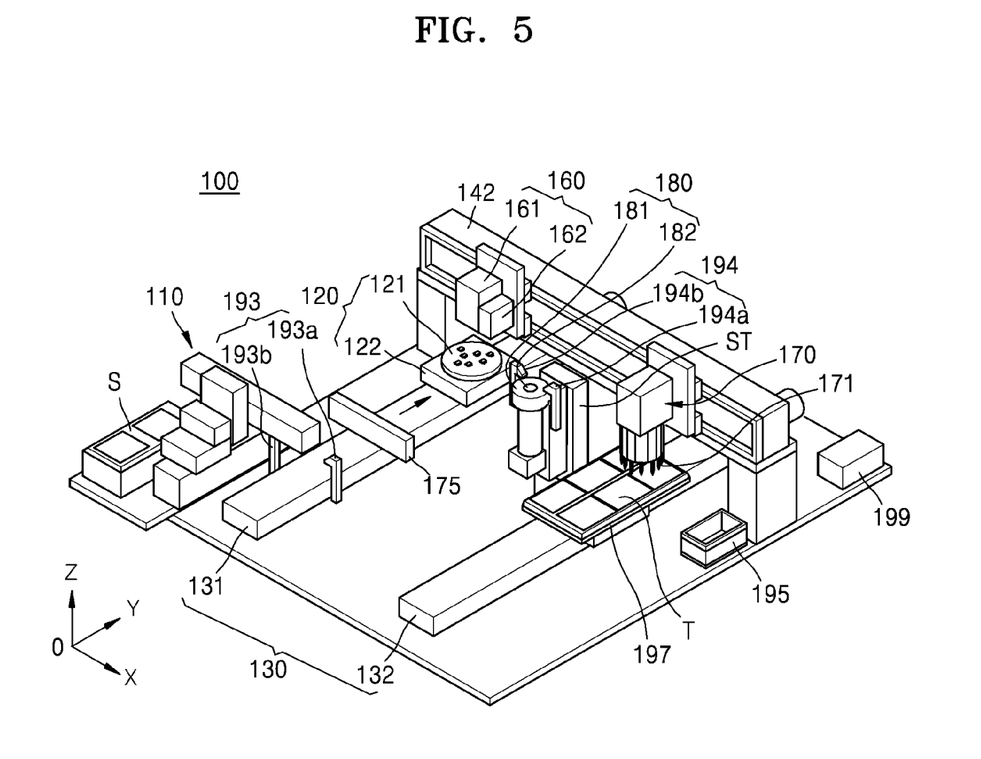

After the component recognizer 150 takes the images of the components P placed on the working plane 121 of the work table 120, the work table guide 131 moves the work table 120 in the positive Y-axis direction. As shown in FIG. 5, the work table 120 moves a position adjacent to a position below a bottom of the rear guide 142.

The first component analyzer 160 moves along the rear guide 142 in the X-axis direction and is placed above the work table 120. The light source 162 irradiates light, and the first component inspection camera 161 captures images of the components P placed on the working plane 121 of the work table 120. The controller 199 performs an exterior inspection for inspecting an exterior of each component P by using the images of the components P which are captured by the first component inspection camera 161 in order to classify the components P into the good components and the defective components and identifies a central location of each component P (a first component inspection operation).

Figure 6:
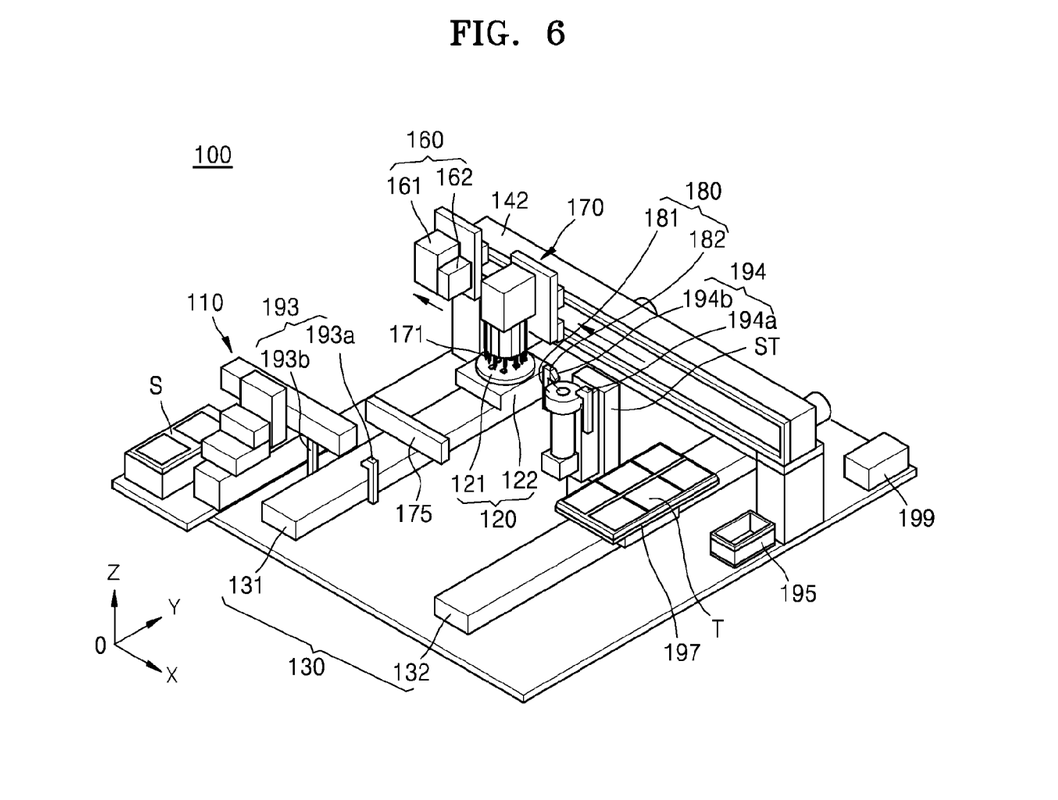

After the first component analyzer 160 takes images of the components P placed on the working plane 121 of the work table 120, the first component analyzer 160 is moved along the rear guide 142 in a negative X-axis direction. Furthermore, the rotary head 170 is moved along the rear guide 142 in a negative X-axis direction and is placed above the work table 120, as shown in FIG. 6.

According to the control of the controller 199, the rotary head 170 uses the nozzles 171 and sucks the components P placed on the working plane 121 of the work table 120. That is, while the rotary head 170 rotates according to the control of the controller 199, the nozzles 171 suck the components P, respectively. In this case, the controller 199 controls the nozzles 171 to suck only the good components that are classified based on the images captured by the first component analyzer 160.

Figure 7:
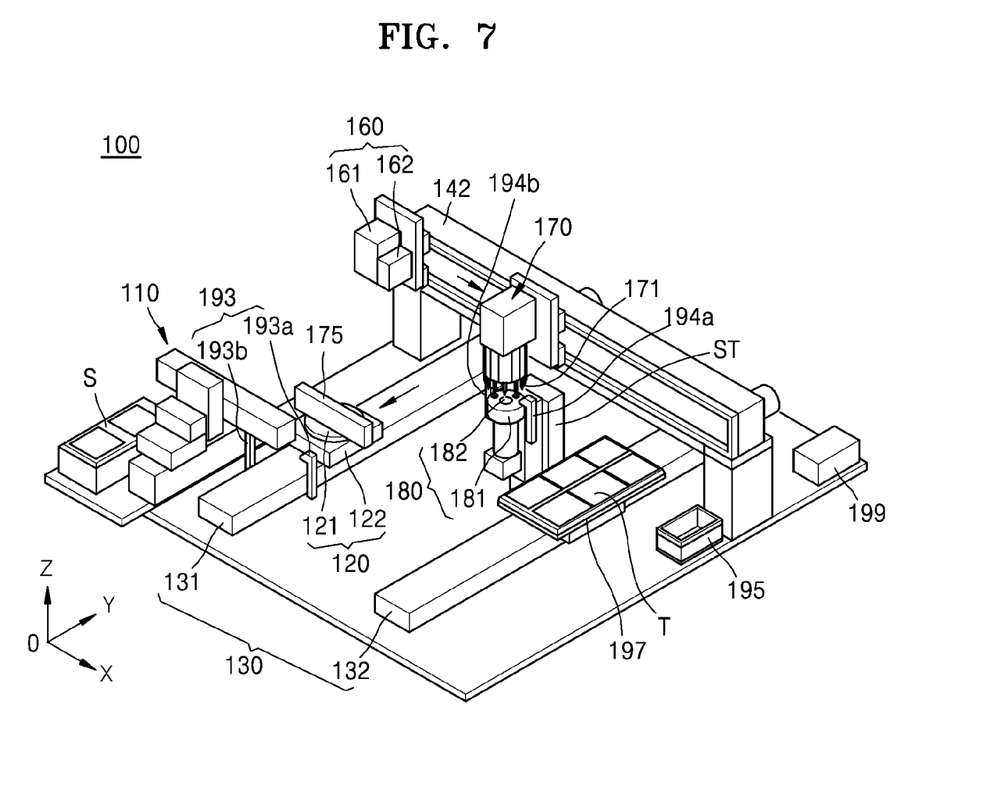

As shown in FIG. 7, after the rotary head 170 sucks the components P, the rotary head 170 moves along the rear guide 142 in the positive X-axis direction and reaches the support ST. The second component analyzer 180 and the second impurity remover 194 are installed on the support ST.

The controller 199 blows the impurities such as dust attached onto the components P by strongly discharging air through the second air blow nozzle 194a in a direction of each component P sucked by the nozzles 171. The second vacuum 194b sucks the blown impurities. Therefore accuracy can be improved in inspection process and a failure rate of components can be reduced.

According to the control of the controller 199, the light source 181 of the second component analyzer 180 irradiates light, and the second component inspection camera 182 captures images of surfaces of components P sucked by an end of each nozzle 171 in an upward direction. If images are captured in an upward direction, it is possible to capture images of bottom surfaces of the components P, which may not be performed in the first component inspection operation. Thus, defective components are rather accurately classified. The controller 199 performs an exterior inspection for inspecting an exterior of each component P sucked by each nozzle 171 by using the images of the components P which are captured by the second component inspection camera 182 in order to classify the components P into good components and defective components (a second component inspection operation).

If thicknesses of the components P sucked by the end of each nozzle 171 are too small or great and a focus of the second component inspection camera 182 is not accurately adjusted while the second component inspection camera 182 captures images of the components P, the controller 199 properly adjusts heights of the nozzles 171 that suck the components P and controls the second component inspection camera 182 to capture the images. Then, it is unnecessary to install an additional focus adjusting device on the second component inspection camera 182.

The work table 120, where the defective components that are not sucked by the nozzles 71 are left, reaches the bottom of the component retriever 175 by moving along the work table guide 131 in the negative Y-axis direction, and the component retriever 175 retrieves the defective components left on the work table 120.

Figure 8:
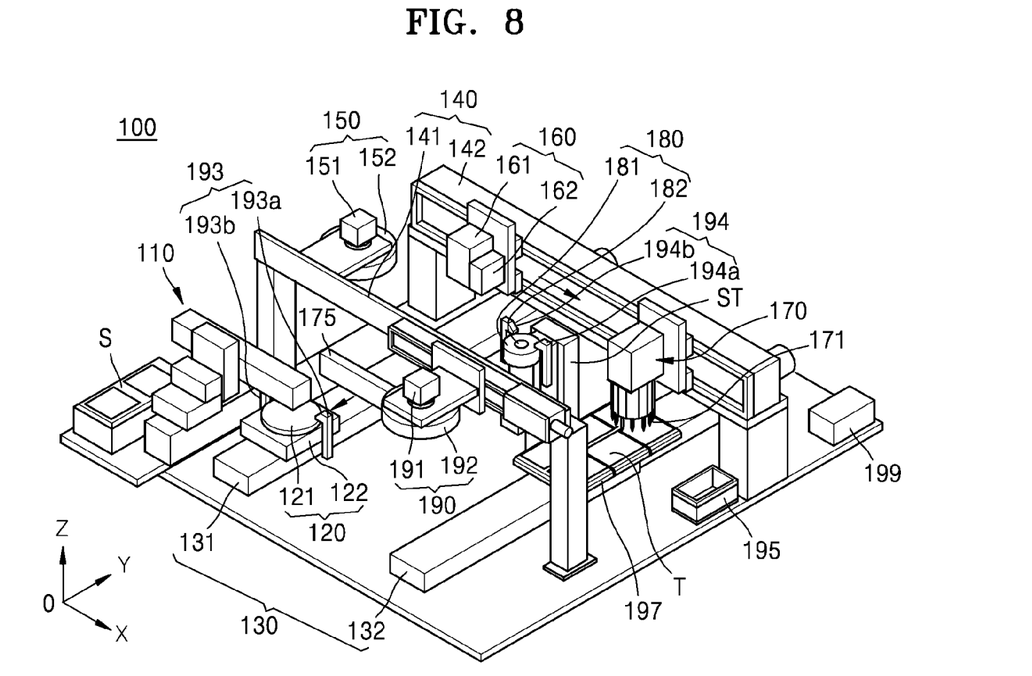

The rotary head 170 further moves along the rear guide 142 in the positive X-axis direction, and as shown in FIG. 8, the rotary head 170 reaches above the tray T disposed on the tray support 197.

As shown in FIG. 9, the rotary head 170 places the good components, which are sucked by the nozzles 171 from among the components P, in the component grooves G of the tray T, according to the control of the controller 199. That is, the controller 199 places the good components in the component grooves G of the tray T, wherein the good components are classified after the exterior inspection for inspecting an exterior of each component P is performed by using the images of the components P which are captured by the second component inspection camera 182 in order to classify the components P into the good and defective components.

After placing the good components, which are sucked by the nozzles 171 from among the components P, the rotary head 170 further moves along the rear guide 142 in a positive X-axis direction and reaches the upper region of the dump box 195. Then, the defective components that are sucked by the nozzles 171 are fell into the dump box 195, and the dump box 195 collects and discards the defective components.

After all of the components P are arranged in the component grooves G of the tray T, the controller 199 moves the tray analyzer 190 towards the tray guide 132 and moves the tray support 197 along the tray guide 132 in the negative Y-axis direction. Thus, as shown in FIG. 10, the tray T is located under the tray analyzer 190.

The light source 192 of the tray analyzer 190 irradiates light, and the tray inspection camera 191 takes an image of the upper surface of the tray T placed on the tray support 197. The controller 199 determines whether the components P are not placed in the component grooves G of the tray T by using the images taken by the tray inspection camera 191 and the components P are arranged well in the component grooves G, and if there are defects, the controller 199 generates an alarm.

As described above, the component loading apparatus 100 according to one or more embodiments determines whether the components P have defects through the exterior inspection by using the first and second component analyzers 160 and 180 before the components P are loaded on the tray T, and loads the good components are loaded on the tray T. Then, it is unnecessary to perform an additional process for identifying defects of the components P after a loading process. As a result, an overall procedure may be simplified, and thus, loading costs may be reduced.

Moreover, the component loading apparatus 100 performs the exterior inspection by performing the first component inspection operation using the first component analyzer 160 before the nozzles 171 of the rotary head 170 suck the components P and then performing the second component inspection operation using the second component analyzer 180 after the nozzles 171 of the rotary head 170 suck the components P. Thus, the component loading apparatus 100 determines whether the components P have defects by capturing images of all surfaces thereof. Then, it is possible to rather clearly determine whether the components P to be loaded on the tray T have defects, and a defect rate with respect to the tray T may be reduced.

The component loading apparatus uses the rotary head 170 having the nozzles 171, which are arranged in a circumferential direction, in order to transport the components P to a tray. Therefore, since a large number of components may be effectively transported by using a rotary head with a small volume, a size of the component loading apparatus 100 may be reduced, and an installation space thereof may be decreased. However, the inventive concept is not limited to using only a rotary head having a plurality of nozzles like the above exemplary embodiment, and thus, a different type of head and nozzles may be used for the component loading apparatus.

In addition, the component loading apparatus 100 uses the first and second impurity removers 193 and 194 so as to surely remove the impurities attached onto the components P. As a result, each inspection process has increased reliability, and the components P, from which the impurities are clearly removed, may be loaded on the tray T. The tray T, on which the components P having no impurities are loaded, may not have defects, and the marketability of the tray T is increased.

As described above, according to the one or more of the above exemplary embodiments, a component loading apparatus uses a rotary head having nozzles, which are arranged in a circumferential direction, in order to transport components to a tray. Therefore, a large number of components may be effectively transported by using a rotary head with a small volume.

Furthermore, since the component loading apparatus according to one or more embodiments loads only good components on a tray, which are classified through an exterior inspection, before the products are loaded, it is unnecessary to perform an additional process for classifying defective components after the components are loaded on the tray. Therefore, a manufacturing procedure may be simplified, and manufacturing costs may be reduced.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present inventive concept as defined by the following claims.

What is claimed is:

1. A component loading apparatus comprising:
a work table comprising a working plane;
a component recognizer configured to recognize components placed on the working plane of the work table; a rotary head configured to suck the components;
a tray support for supporting a tray on which the components sucked by the rotary head are loaded; and
an impurity remover configured to remove impurities attached onto the components in at least one of a first state of being placed on the working plane of the work table and a second state of being sucked by the head.

2. The component loading apparatus of claim 1, further comprising a tray analyzer configured to inspect loading positions of the components on the tray.

3. The component loading apparatus of claim 1, wherein the impurity remover is configured to remove impurities attached onto the components in each of the first state and the second state.

4. The component loading apparatus of claim 3, further comprising a tray analyzer configured to inspect loading positions of the components on the tray.

5. The component loading apparatus of claim 3, wherein the impurity remover comprises:
a first impurity remover configured to remove impurities attached onto the components in the first state; and
a second impurity remover configured to remove impurities attached onto the components in the second state.

6. The component loading apparatus of claim 5, further comprising a tray analyzer configured to inspect loading positions of the components on the tray.

7. A component loading apparatus comprising:
a work table comprising a working plane;
a component recognizer configured to recognize components placed on the working plane of the work table; a rotary head configured to suck the components;
a tray support for supporting a tray on which the components sucked by the rotary head are loaded; and
a component analyzer configured to inspect the components in at least one of a first state of being placed on the working plane of the work table and a second state of being sucked by the head.

8. The component loading apparatus of claim 7, wherein the component analyzer is configured to inspect the components in each of the first state and the second state.

9. The component loading apparatus of claim 8, wherein the component analyzer comprises:
   a first component analyzer configured to inspect the components in the first state; and
   a second component analyzer configured to inspect the components in the second state.

10. The component loading apparatus of claim 7, further comprising an impurity remover configured to remove impurities attached onto the components in at least one of the first state and the second state.

11. The component loading apparatus of claim 10, wherein the impurity remover comprises:
   a first impurity remover configured to remove impurities attached onto the components in the first state; and a second impurity remover configured to remove impurities attached onto the components in the second state.

12. The component loading apparatus of claim 10, further comprising a tray analyzer configured to inspect loading positions of the components on the tray.

13. A component loading apparatus comprising:
   a work table comprising a working plane, wherein the working plane is elastic such that a surface area thereof may be increased or decreased by extending or contracting the working plane;
   a component recognizer configured to recognize components placed on the working plane of the work table; a rotary head configured to suck the components; and
   a tray support for supporting a tray on which the components sucked by the rotary head are loaded.

* * * * *